SEMICONDUCTOR DEVICES COMPRISING A HETEROJUNCTION

Filed Jan. 27, 1970

INVENTORS
TIES S. TE VELDE and
BY SYBRANDUS VAN HEUSDEN

AGENT

United States Patent Office 3,679,496
Patented July 25, 1972

3,679,496
SEMICONDUCTOR DEVICES COMPRISING A HETEROJUNCTION

Ties Siebolt Te Velde and Sybrandus van Heusden, Emmasingel, Eindhoven, Netherlands, assignors to U.S. Philips Corporation, New York, N.Y.

Filed Jan. 27, 1970, Ser. No. 6,066
Claims priority, application Netherlands, Feb. 1, 1969, 6901662
Int. Cl. H01l 7/44
U.S. Cl. 148—188 11 Claims

ABSTRACT OF THE DISCLOSURE

A method of forming a heterojunction in a semiconductor device wherein a substrate of a polycrystalline layer of a II–VI material coated with a thin layer of a halide of copper, silver and/or gold is heated to effect a solid-state reaction wherein a halide layer of the II–VI material is formed in the thin layer and at least one of the metals copper, silver, and gold penetrates into the substrate to form a compound with the VI material which provides a heterojunction with the substrate. The thin layer of the halide of the II material is subsequently removed with a solvent thereof.

The invention relates to a method of manufacturing a semiconductor device in which a body consisting at least on one side at least partly of a first compound of the type II–VI (a so called II–VI compound) is provided with a second compound of at least one of the metals Cu, Ag and Au and at least one of the metalloids of said II–VI compound, forming a hetero-junction with the II–VI compound, to a semiconductor device thus manufactured and to a solar battery comprising at least one of such semiconductor devices. Whereas with a homo-junction in a semiconductor the material on either side of the junction is of the same chemical substance having the same crystal structure (though differently doped), the material on either side of a hetero-junction is essentially different either in chemical nature or in crystal structure or in both.

Such hetero-junctions, provided their structure is well defined, may have interesting electrical properties so that they may be employed for an effective injection or extraction of charge carriers particularly in semiconductors in which satisfactory homo-junctions can be provided only with difficulty. Because, in addition, the optical properties of the semiconductor materials on either side of interface at the hetero-junction may be highly different, the hetero-junction often provides more possibilities than a homo-junction in devices in which an effective excitation or emission of light has to be obtained. Examples thereof are the uses of hetero-junctions in solar batteries or electro-luminescent devices based on II–VI compounds.

However, hitherto the efficiency of said devices was not optimal because the existing methods of applying the hetero-junctions did not result in an adequately defined construction. It is known, for example, to treat a CdS body with a solution of $CuSO_4$, the exchange of Cd- and Cu-ions providing a $Cu_2S$ layer on the CdS, which forms a hetero-junction therewith. In other methods hitherto employed metallic Cu, Ag or Au was applied galvanically or from the vapour phase to a II–VI compound, after which, by heating in a given atmosphere, by means of a chemical reaction also a hetero-junction may be formed between the resultant chalcogenide of the applied metal and the body of the (II–VI) compound. These known methods have the following disadvantages: the layer of the material forming the hetero-junction may be doped only with difficulty and after the required thermal treatments its structure and thickness are not uniform, whilst at the area of the junction a great, insufficiently controlled density of surface levels has in general an adverse effect on the operation of the junction.

According to the invention these disadvantages are avoided by applying, in the method of the kind set forth in the preamble, a layer of a third compound, being a halogen compound of at least one of said metals Cu, Ag and Au, to the semiconductor body, after which by heating, a solid-state reaction between the halide (the third compound) and the II–VI compound produces the second compound forming the hetero-junction, after which the resultant fourth compound of the metal of the II–VI compound and at least one of the halogens is removed by dissolving it.

It is preferred to apply monovalent halogen compounds of the metals concerned, particularly for obtaining a satisfactory photo-voltaic effect. In order to obtain a flat hetero-junction at a uniform depth beneath the surface, particularly at a very small depth, the layer of the halogen compound is preferably applied by evaporation.

The invention will now be described more fully by way of example and with reference to the accompanying drawing.

Figure 1:
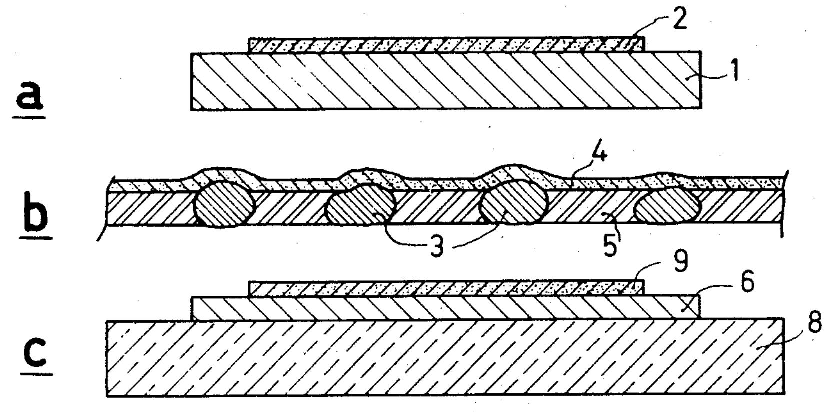
FIG. 1 shows, by way of example, vertical sectional views of three different starting forms of semiconductor members for the manufacture of semiconductor devices with hetero-junctions. All these bodies comprise II–VI compounds, for example, chalcogenides of the bivalent metals Zn, Cd or Hg.

According to FIG. 1*a* the starting member is a plate-shaped single crystal 1 of a II–VI compound, for example, CdS.

According to FIG. 1*b* the starting member is a so-called monograin layer, in which crystal grains 3 of a II–VI compound are embedded, in the manner shown, in a film 5 of a synthetic resin for example polyurethane, surface parts of the grains 3 being free from the resin at both sides of the monograin layer.

According to FIG. 1*c* the starting member is a polycrystalline layer 6 of II–VI material applied to a substrate 8 of, for example, glass by vapour deposition.

In a first step of the method in accordance with the invention such a body is provided or coated with a thin layer (2, 4 and 9 of FIGS. 1*a*, 1*b* and 1*c* respectively) of a halide of Cu, Ag and/or Au, for example, CuCl, by evaporation in vacuo, the II–VI body being substantially at room temperature. The temperature of the vaporizing source is adjusted so that a constant vapour flow is obtained. In the case of CuCl the vaporization vessel was heated at 600° C. for a few minutes. Such a deposited CuCl layer may have a preferred thickness between 0.05 and $2\mu$, for example, $0.2\mu$. The layer material substantially does not react with the II–VI substrate (which may consist of CdS) during the vapour deposition process. The layer thus provided has a well defined geometry, for example, it has a uniform thickness.

The member provided with the CuCl-layer is then subjected to a heating process, preferably between 100° C. and 400° C., preferably for 1 to 30 minutes, for example, for 3 minutes, the temperature being maintained, for example, at 150° C. A reducing atmosphere, for example, of hydrogen may be used, but a neutral atmosphere, for example, of nitrogen or a rare gas may also be employed, whilst a small content of oxygen or hydrogen is permissible. It is found that under these conditions a solid-state reaction occurs, in which copper penetrates to a well defined depth into the CdS and forms cuprous sulphide, whilst at the same time the cadmium migrates out through the same layer thickness over which said reaction takes place, forming a layer of cadmium chloride which occupies about the same space as the initially vapour-deposited copper chloride. This $CdCl_2$ layer is subsequently removed by means of a suitable solvent, for example, an alcohol or water. The surface thus exposed is found to have maintained the original structure of the II–VI surface; this is a result of the fact that in said solid-state reaction the metalloid ions forming a close-packed structure in the crystal structure of the II–VI body have not appreciably changed in place.

Such an assembly of cuprous sulphide and CdS already operates as a hetero-junction. The plane formed by the junction, i.e. the interface between the two different substances, may be defined experimentally by dissolving the cuprous sulphide selectively in a KCN solution. This interface appears to have a very well defined structure with at most a few unevennesses. It is located at a depth beneath the initial II–VI surface which is slightly smaller (5 to 10%) than the layer thickness of the vapour-deposited halide and the plane of the junction extends substantially accurately parallel to the initial II–VI surface. These particularities are already proof of the special advantages of the method according to the invention as compared with the known methods mentioned before, by means of which it is practically impossible to obtain a hetero-junction of such a well defined structure. Therefore, in order to avoid subsequent short-circuits in the methods hitherto used a considerably thicker II–VI body had to be used at the start than is required in the novel method.

The electrical properties of the above described hetero-junction may be considerably influenced by a thermal after-treatment. The yield of the photo-voltaic effect in such a junction may be further enhanced by subjecting the assembly, subsequent to dissolution of the halide formed, to a tempering treatment at a temperature lying between 150° C. and 300° C., preferably for at least one minute, for example, for a few minutes at 180° C. It is preferred to use a neutral atmosphere, for example, consisting in this case, of nitrogen, to which traces of $O_2$ and/or $H_2O$ are added (for example in a concentration of about 1%). For the manufacture of junctions having optimal rectification properties without illumination a slightly different thermal after-treatment may be used. Heating may be carried out, for example, for one minute at 100° C. in $(NH_4)_2S$ vapour so that the composition of the cuprous sulphide layer is shifted towards a higher value of the atomic ratio of sulphur copper. A different means for promoting this shift from $Cu_2S$ towards CuS consists in forming a layer of cupric chloride or cuprous- and cupric-chloride, for example, by treating the vapour-deposited cuprous chloride layer with chlorine gas, as a result of which the copper compound taking part in the subsequent solid-state reaction is already less rich in copper.

Figure 2:
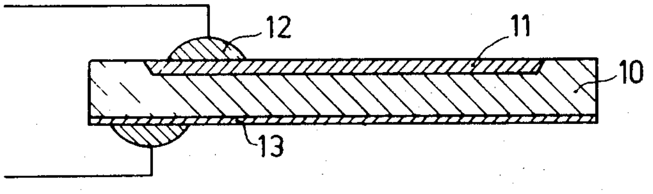
FIG. 2 shows a vertical cross-section of a semiconductor device prepared by the method according to the invention.
Figure 3:
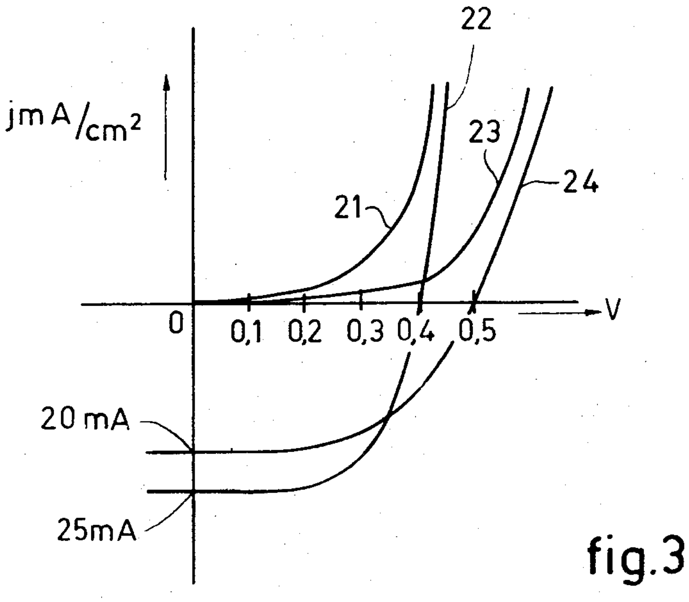
FIG. 3 is a graph showing current-voltage characteristics of the device shown in FIG. 2.

FIG. 2 shows a semiconductor device, more specifically a photo-cell, based on a single crystal of CdS 10 manufactured by the method according to the invention. The cuprous sulphide layer 11 is locally provided with a contact 12 by means of a conductive silver paste, whereas the rear side of the CdS crystal is provided with an indium contact 13 by vapour deposition. The *c*-axis of the hexagonal crystal plate is at right angles to the plate surface and hence also at right angles to the plane of the hetero-junction. The current-voltage characteristics of this photo-cell are shown by the curves in the graph of FIG. 3 (*j* is the current density in ma./cm.$^2$; V is the voltage between the contacts 12 and 13 of FIG. 2). The curve 21 relates to the unexposed state. The curve 22 relates to an exposure to radiation having a density of 100 mw./cm.$^2$ from a light source having a radiation temperature of 3000° C., which substantially corresponds to direct, solar exposure at right angles. The copper sulphide layer had been applied to the cadmium side of the CdS crystal plate. The curves 23 and 24 relate in a similar manner to a cell of the same kind, the copper chloride being applied, however, to the sulphur side of the CdS crystal plate, the curve 23 relating to the unexposed state and the curve 24 to a similar illumination as in the case of curve 22. The polar nature of the hexagonal crystal structure of CdS comes to light in a difference between the open voltages and short-circuit currents of these two photo-cells. From the characteristic curves of the exposed state it may be inferred that the energy efficiency of these cells, which, by the method according to the invention, now may be manufactured in a reproducible manner, amounts to about 7%.

This method may furthermore be used in the case of surfaces having other crystal orientations, the resultant photo-cells also having a satisfactory efficiency. It is also possible to start from polycrystalline II–VI material.

In particular, when monograin layers of II–VI grains embedded in an organic binder (see FIG. 1*b*) are used, the method in accordance with the invention provides photo-voltaic cells of high quality.

What is claimed is:

1. A method of manufacturing a semiconductor device which comprises: providing a substrate of a poly-crystalline layer of a II–VI material, coating said substrate with a thin layer of a halide of at least one metal selected from the group consisting of copper, silver and gold, heating said thus coated substrate to produce a solid state reaction between said coating and said substrate wherein a layer of a halide of said II–VI material is formed on the surface of said thin layer, and said at least one metal is caused to penetrate below the surface of said substrate to form a compound with the VI portion of said II–VI material between said substrate and said thin layer, and removing said layer of said halide of the II portion of said II–VI material by means of a solvent thereof, whereby a hetero-junction is formed between said substrate and said newly formed compound of said VI material.

2. A method as claimed in claim 1 wherein said thin layer of said halide is applied by vapour deposition.

3. A method as claimed in claim 2, wherein the thickness of the deposited halide layer lies between 0.05 and $2/\mu$.

4. A method as claimed in claim 1, wherein said solid-state reaction occurs at a temperature lying between 100° C. and 400° C.

5. A method as claimed in claim 4, wherein the duration of heating for said solid-state reaction lies between 1 minute and 30 minutes.

6. A method as claimed in claim 1 wherein said solvent for dissolving and removing said halide after the solid-state reaction, includes water and an alcohol.

7. A method as claimed in claim 1, wherein the semiconductor body provided with the hetero-junction is subjected to an annealing process at a temperature lying between 150° C. and 300° C. subsequent to said removing step.

8. A method as claimed in claim 7, wherein the annealing process is carried out in a substantially inert atmosphere containing traces of a gas selected from the group consisting of oxygen and hydrogen.

9. A method as claimed in claim 7, wherein the duration of the annealing process is at least one minute.

10. A method as claimed in claim 1, wherein the II–VI material of said substrate consists mainly of CdS and said halide applied thereto consists mainly of CuCl.

11. A method as claimed in claim 1, in which said substrate comprises a monograin layer composed of a one grain thick layer of grains of said II–VI material embedded in a film of a synthetic resin.

References Cited

UNITED STATES PATENTS

| | | | |
|---|---|---|---|
| 3,146,138 | 8/1964 | Shirland | 148—188 |
| 2,820,841 | 1/1958 | Carlson et al. | 148—186 |
| 2,844,640 | 7/1958 | Reynolds | 148—1.5 UX |
| 3,279,962 | 10/1966 | Grimmeiss et al. | 148—188 |
| 3,284,252 | 11/1966 | Grimmeiss et al. | 148—188 |

L. DEWAYNE RUTLEDGE, Primary Examiner

J. M. DAVIS, Assistant Examiner

U.S. Cl. X.R.

148—1.5, 186